United States Patent [19]

Thevenin

[11] Patent Number: 4,746,300

[45] Date of Patent: May 24, 1988

[54] MOUNTING PANEL FOR REMOVABLE ELEMENTS

[76] Inventor: Gilles Thevenin, 14d rue René Coty, 71100 Chalon-sur-Saone, France

[21] Appl. No.: 937,310

[22] Filed: Dec. 3, 1986

[30] Foreign Application Priority Data

Jun. 9, 1986 [EP] European Pat. Off. ........ 86401236.4

[51] Int. Cl.⁴ ........................... H01R 9/09; H05K 3/30
[52] U.S. Cl. ........................................ 439/82; 29/837; 174/68.5
[58] Field of Search ............. 339/17 C, 17 LM, 17 E, 339/49 R, 17 LM; 29/837; 174/68.5; 439/78, 82

[56] References Cited

U.S. PATENT DOCUMENTS 3,862,790  1/1975  Davies et al. .................. 174/68.5 X
3,982,320  9/1976  Buehoff et al. ............ 339/17 LM X

FOREIGN PATENT DOCUMENTS 69212  1/1983  European Pat. Off. .
2743877  4/1979  Fed. Rep. of Germany .... 339/17 C
2804587  8/1979  Fed. Rep. of Germany .
3104441  2/1982  Fed. Rep. of Germany .... 339/17 C
73-73392  6/1977  Japan ................................ 339/17 C
83-3318   9/1983  PCT Int'l Appl. .

Primary Examiner—P. W. Echols
Assistant Examiner—Carl J. Arbes
Attorney, Agent, or Firm—McAulay, Fields, Fisher, Goldstein & Nissen

[57] ABSTRACT

A mounting panel is provided for removable elements, in particular for educational toys, for forming simple "in the air" electronic assemblies of the "Eiffel tower" assembly type, from elementary components, comprising a support pierced with holes opening into at least one surface of the support and containing respectively tufts of hairs parallel to each other. These tufts of hairs form studs which may be used for fitting longitudinally therein the legs of components to be mounted on the panel. For facilitating the fabrication of such a panel the tufts of parallel hairs are engaged in the respective holes of the support by leaving a part of the hairs extending outwardly in the manner of the hairs of a brush and then the tufts of hairs are cut flush with the face of the support in which the holes open out.

7 Claims, 1 Drawing Sheet

MOUNTING PANEL FOR REMOVABLE ELEMENTS

BACKGROUND OF THE INVENTION

1. Field of the Invention

The present invention relates to a method of fabricating a mounting panel for removable elements, in particular for educational toys allowing simple "in the air" electronic circuits to be made, or assemblies of the "Eiffel tower" type, etc., as well as a mounting panel obtained by this method.

2. Description of the Prior Art

In usual mounting panels a support made from an insulating material is used on which are disposed conducting contact points or in which are pierced holes in which are molded plugs of a flexible conducting material as is described in the patent FR-A-No. 2 363 967. Mounting panels of the kind considered are formed of contact springs mounted between an upper plate and a lower plate and accessible, for connecting, through holes pierced in the upper plate. Another known mounting panel is formed, as is described in the patent FR-A-No. 2 446 544, by an annular groove having an internal wall and an external wall and by a resilient element disposed in the annular groove, it being understood that the internal and external walls may be electrically conducting and the resilient element isolating or vice versa.

There is also known, as described in the patent EP-A-No. 0 069 212, a connecting panel made from an insulating material, pierced with holes opening into one of its faces and in which are engaged bunches of parallel conducting wires extending flush with the face of the panel. The internal ends of the wires of the same bunch are embedded in a conducting material base to which is connected an electric conductor usually in the form of a printed circuit track.

A mounting panel of the above type is obviously difficult to fabricate, requiring the use of several machines and therefore is of a high cost price.

The present invention aims at overcoming these disadvantages by providing a particularly simple fabricating means which results in relatively low cost price. In addition, this kind of mounting, allows a good contact to be kept after numerous handling operations.

SUMMARY OF THE INVENTION

To this end, this method of fabricating a panel for mounting removable elements, in particular for educational toys, allowing simple, "in the air" electronic assemblies of the "Eiffel tower" assembly type, to be formed from elementary components, comprising a support pierced with holes opening into at least one face of the support and containing respectively tufts of hairs parallel to each other thus forming studs which may be used for fitting longitudinally therein the legs of components to be mounted on the panel, is characterized in that the tufts of parallel hairs are engaged in respective holes of the support while leaving a part of the hairs extending outwardly in the manner of the hairs of a brush, and then the tufts of hairs are cut flush with the face of the support in which the holes open out.

The hairs used for forming the "studs" may be made from metal or from a synthetic electrically conducting material or else may be made from an insulating material when the electric connection function does not have to be provided. The "studs" may be advantageously formed by tufts of hairs packed in the holes so that each hair forms a sort of U in the hole, the U shaped hairs of each tuft being fixed in the holes by means of a nail or staple driven in the bottom of the hole.

The holes pierced in the mounting panel for housing the tufts of hairs may be blind holes or else they may pass through the panel from one side to the other.

According to a complementary feature of the invention the hairs forming the studs are strands waved in the longitudinal direction.

The applications of the mounting panel of the invention are numerous and varied. There may be mentioned for example the simple "in the air" electronic assemblies of the "Eiffel tower" assembly type, or else creations based on wire (or another material) using the same technique as the wires for connecting electronic components, for example the presentation of objects on a wire cradle, wire shaped figures, etc . . .

BRIEF DESCRIPTION OF THE DRAWINGS

Several embodiments of the present invention will be described hereafter by way of non limitative examples with reference to the accompanying drawings in which.

DESCRIPTION OF THE PREFERRED EMBODIMENTS

Figure 1:
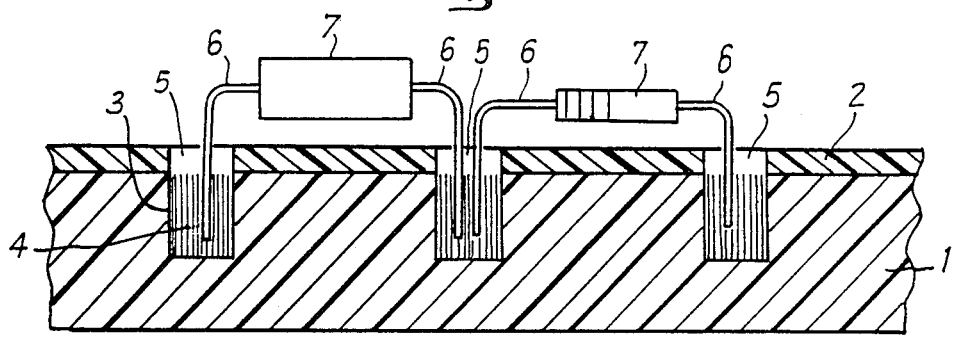
FIG. 1 is a sectional view of a mounting panel obtained by the method of the invention, perpendicularly to the surface of this panel.

FIG. 1 shows a mounting panel supporting two electric components and which is formed essentially of a support 1 made from an electrically insulating material covered or not by a plastic material cover 2. The insulating support is pierced with holes 3, preferably blind holes, which open into its upper face. In these blind holes are respectively housed tufts of conducting or on the contrary insulating synthetic or metal hairs 4 forming studs 5, each individual stud 5 being totally isolated from the other studs 5. In some studs 5 are inserted, depending on the assembly it is desired to construct, wires 6, for connection with electronic components such as elements 7. The connecting wires 6, extending from component 7, may have the same diameter or different diameters. In all cases, the electric connection between two connecting wires engaged in the same stud 5 is ensured under the best conditions, because of the relative transverse elasticity of the hairs of each tuft 4.

Figure 2:
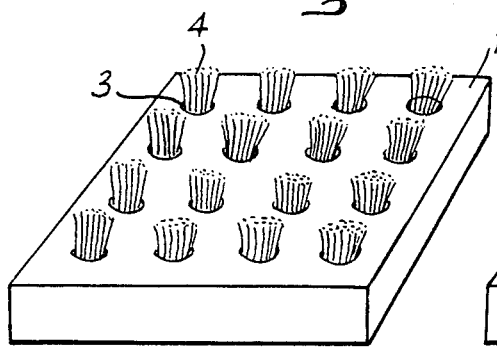
FIG. 2 is a perspective view of the panel after positioning of the tufts of hairs and before these tufts are made flush.

The method of fabricating the panel of the invention consists, starting with an insulating plate forming the insulating support 1, in piercing holes 3 in this plate and engaging in this hole a tuft of hairs 4 extending outside the hole (FIG. 2) just as the hairs of a brush are fixed in a support for example made from wood.

Figure 3:
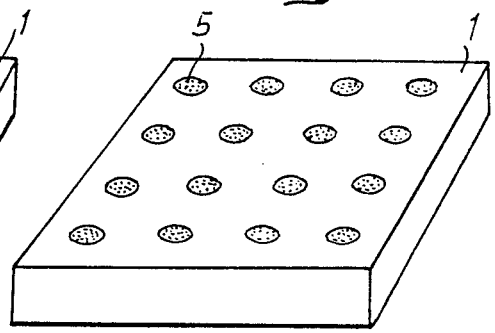
FIG. 3 is a perspective view of the panel after the tufts of hairs have been made flush.

Then the hairs 4 are cut flush with the upper face of the support plate 1 so as to obtain a panel ready for use as is illustrated in FIG. 3. In this Figure can be seen the studs 5 formed in the support plate 1 after the tufts of hairs have been cut flush with the support.

Figure 4:
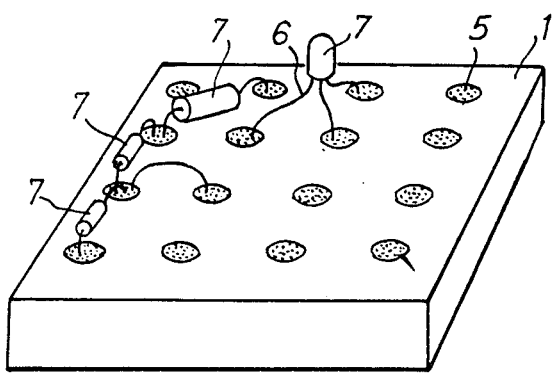
FIG. 4 is a perspective view of the mounting panel supporting an electric circuit or a wire assembly.

In the embodiment of the invention shown in FIG. 4 is shown one application of the mounting panel of the invention. Support 1 in which studs 5 have been housed in the way described with reference to FIGS. 2 and 3 supports elementary components 7 inserted in the studs 5 by means of connecting wires 6.

Figure 5:
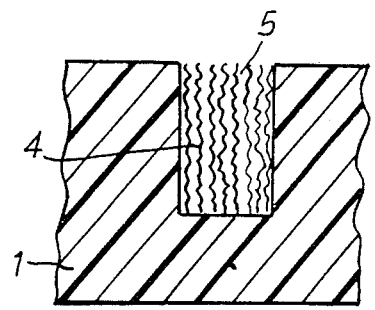
FIG. 5 is an axial sectional view of a "stud" formed by wavy strands.

In the variant of construction of the invention shown in FIG. 5, the tufts of hairs 4 forming the studs 5 are formed by wavy strands.

Figure 6:
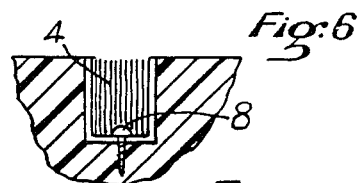
FIG. 6 is a sectional view of a variant.

In a variant of construction of the invention shown in FIG. 6, studs 5 may be advantageously formed by tufts of hairs packed into the holes 3 so that each hair 4 forms a sort of U in the hole, the U shaped hairs of each tuft being fixed in the hole by means of a nail or staple 8 driven into the bottom of the hole.

What is claimed is:

1. A mounting panel for removable elements, in particular for educational toys, for effecting simple "in the air" electronic assemblies of the "Eiffel Tower" assembly type, from elementary components having legs for mounting the removable elements onto said mounting panel, comprising:

a support pierced with holes opening into at least one face of the support;

in each said holes, tufts of hairs parallel to each other thus forming studs which may be used for fixing longitudinally therein the legs of components to be mounted on the panel, said tufts of parallel hairs being engaged in the respective holes of said support while having said hairs in said hole adjacent to each other in the manner of the hairs of a brush;

said tufts of hairs being cut flush with the face of the support in which said holes open out;

in each said hole said tufts of hairs are packed so that each hair forms a sort of U in the hole; and said U-shaped hairs of each said tuft being fixed in said hole by means of a nail driven into the bottom of the hole.

2. The panel as claimed in claim 1, wherein hairs formed by strands waved in the longitudinal direction are driven into each hole.

3. The panel as claimed in claim 1, wherein said holes are blind holes.

4. The panel as claimed in claim 1, wherein said holes pass through the panel from one side through the other.

5. The panel as claimed in claim 1, wherein said support is made of insulating material so that each stud is isolated from the other studs.

6. A method of fabricating a mounting panel for removable elements, in particular for educational toys, for effecting simple "in the air" electronic assemblies of the "Eiffel Tower" assembly type, from elementary components having legs for mounting the removable elements onto said mounting panel, comprising:

piercing a support to provide holes opening into at least one face of the support;

inserting into said holes tufts of hair parallel to each other thus forming studs which may be used for fixing longitudinally therein said legs of the components to be mounted on said panel;

engaging the tufts of paralle hairs in the respective holes of said support while leaving a part of the hairs extending outwardly in the manner of the hairs of a brush;

cutting the tufts of hairs flush with the face of the support in which the holes open out;

packing the tufts of haris in each hole so that each hair forms a sort of U in the hole; and fixing the U-shaped hairs of each tuft in the hole by means of a nail driven into the bottom of the hole.

7. The method as claied in claim 6, including forming the hairs by wavy strands waved in the longitudinal direction and driving waved strands of hair into each hole.

* * * * *